United States Patent [19]

Watanabe et al.

[11] Patent Number: 5,319,159
[45] Date of Patent: Jun. 7, 1994

[54] DOUBLE-SIDED PRINTED WIRING BOARD AND METHOD OF MANUFACTURE THEREOF

[75] Inventors: Kouichi Watanabe; Isao Furuhashi, both of Tokyo, Japan

[73] Assignees: Sony Corporation; YKC Corporation, Tokyo, Japan

[21] Appl. No.: 991,553

[22] Filed: Dec. 15, 1992

[51] Int. Cl.$^5$ .............................. H05K 1/00
[52] U.S. Cl. ..................... 174/262; 174/264; 174/266
[58] Field of Search ............ 174/262, 263, 264, 265, 174/266, 250, 260; 361/403, 404

[56] References Cited
U.S. PATENT DOCUMENTS 4,659,931 4/1987 Schmitz et al. .
4,791,248 12/1988 Oldenettel .

FOREIGN PATENT DOCUMENTS

| | | |
|---|---|---|
| 64-24491 | 1/1987 | Japan . |
| 63-38878 | 8/1988 | Japan . |
| 64-29868 | 2/1989 | Japan . |
| 1-143292 | 6/1989 | Japan . |
| 2-134895 | 5/1990 | Japan . |

*Primary Examiner*—Leo P. Picard
*Assistant Examiner*—Cheryl R. Figlin
*Attorney, Agent, or Firm*—Wenderoth, Lind & Ponack

[57] ABSTRACT

A double-sided printed wiring board includes a base plate having a copper foil laminated on each of the opposite sides thereof. The copper foil-laminated base plate has through-holes extending therethrough, and at least one of the through-holes is internally plated for providing a through-via-hole into which a resin filler is provided and solidified. A closed through-via-hole is thus obtained. The copper foil-laminated base plate including the closed through-via-hole is copper-plated, and a particular wiring pattern is formed thereon. A chip land is formed in alignment with the closed through-via-hole.

5 Claims, 4 Drawing Sheets

DOUBLE-SIDED PRINTED WIRING BOARD AND METHOD OF MANUFACTURE THEREOF

BACKGROUND OF THE INVENTION

1. Field of the Invention

The present invention relates generally to printed wiring boards, and more particularly it relates to a double-sided printed wiring board on which semiconductor-based integrated circuits (referred hereinafter to as "ICs") may be mounted, and a process of manufacturing such double-sided printed wiring boards.

2. Description of the Prior Art

Typically, a conventional printed wiring board carries ICs as well as other discrete electronic components and circuit elements, which are interconnected to provide the particular electronic circuit functions. In the prior art, those ICs, discrete electronic components and circuit elements are usually bonded to the printed wiring board via holes formed in the printed wiring board through which lead wires may be inserted and soldered to the board. However, there have been advances in surface mounting technology widely employed in the printed wiring board manufacturing field. This technology permits an IC to be mounted together with its associated elements on the printed wiring board without forming any through-holes in the board. Thus, ICs and other on-chip elements may be mounted on a chip land directly without using the through-holes.

To provide for the interconnections between the on-chip elements on the chip land on one side and any circuit on the opposite side of the printed wiring board, the appropriate through-via-holes must be provided remotely from the chip land, and any wiring pattern required for interconnecting the elements via the through-via-holes must be formed on the surface of the base plate.

Thus, according to the prior art, the chip land and through-via-holes must be provided at different locations on the printed wiring board. As the size of each of the IC and other elements is reduced, a corresponding reduction in the size of the chip land is required so that they can be mounted on the chip land. The wiring pattern that includes leads drawn out from the chip land and distributed across different locations must be accordingly fine, but technically, this is practically difficult to achieve. It is also difficult to secure the space required for wiring the leads. In particular, for a double-sided high-density wiring pattern implementation, this space limitation poses a problem.

The through-via-holes formed in the printed wiring board are exposed on each of the opposite sides of the board. When leads are inserted through the corresponding through-via-holes, and the associated circuit components are fixed by the board in solder, surplus solder may flow through the through-via-holes, thereby reaching the components on the chip land.

SUMMARY OF THE INVENTION

The principal object of the present invention is to solve the prior art problems as described above. According to the present invention, it is possible to eliminate the need of forming the wiring pattern on either of the opposite sides of a printed wiring board that is required in the prior art for interconnecting the chip land and through-via-holes.

Another object of the present invention is therefore to provide a double-sided printed wiring board that achieves the above object, and to provide a method of manufacture thereof whereby such a double-sided printed wiring board can be manufactured to achieve the above same object.

Another object of the present invention is to provide a double-sided printed wiring board and a method of manufacture thereof wherein through-via-holes are provided in such a way that no surplus solder can overflow through the through-via-holes.

To accomplish the above objects, the double-sided printed wiring board of the present invention includes a base plate having a wiring pattern printed on each of the opposite sides thereof, at least one of the opposite sides having a chip land formed thereon. The chip extends directly over a through-via-hole which is filled with any suitable synthetic resin.

The chip land that has been described above covers the synthetic resin filling and solidified in the particular through-via-hole. Preferably, the synthetic resin filler that has been solidified may be flattened to be flush with the plane of the through-via-hole by removing or planing any surplus resin that is forced out from the exposed ends of the hole.

The present invention also provides a method of manufacturing such a double-sided printed wiring board, including a sequence of steps as follows:

(a) laminating a copper foil or thin film onto a base plate on each of its opposite sides;

(b) forming a number of through-holes through the base plate and then plating the inside of the through-holes, thereby providing through-via-holes;

(c) filling at least one of the through-via-holes with any suitable synthetic resin and allowing the resin to solidify, thereby closing the hole which may be referred to as the closed (not through) through-via-hole;

(d) plating the base plate on the opposite sides thereof; and (e) forming a chip land over the closed through-via-hole on at least one of the opposite ends thereof.

Plating the inside of the through-via-holes and plating the copper foil-laminated base plate on its opposite sides may be accomplished by a non-electrolytic copper plating process, followed by an electrolytic copper plating process.

The synthetic resin that has filled and has been solidified in the particular through-via-hole may have been forced out of the through-via-hole. When this occurs, any surplus resin that exists outside the hole may preferably be removed so that it can be flush with the plane of the exposed end of the hole.

The copper foil-laminated plate includes copper foils on the opposite sides thereof which constitute a double-sided printed wiring board. It may comprise a base plate such as paper, glass or the like that provides the support, any synthetic resin such as phenol, polyester, epoxy, polyimide, teflon (trademark), polysulfone, fluorine, and other similar resins that are capable of fixing the support, and copper foils that are used for making wiring patterns.

There are several methods of providing a suitable resin in the through-via-holes. One example is the screen printing method. Another example is a thermal bonding process using a press. In the latter process, a base sheet such as a glass cloth and the like is impregnated with any suitable resin, and the resin-impregnated base sheet is formed into a sheet called a prepreg by hardening it thermally until the impregnated resin assumes a half-hardened state. Then, a single or several sheets of prepreg are inserted into the through-via-hole, and are then thermally bonded to the through-via-hole 5 by using the press. Generally, the screen printing process is preferred because it requires no complicated equipment such as that used for the thermal bonding process. The resin that is used with the screen printing process should preferably contain less solvent, specifically less than 10% of solvent.

When the screen printing process is used to fill the through-via-hole completely with resin, there may inevitably occur surplus resin that overflows the through-via-hole. This surplus resin may be removed by any mechanical planning means in such a manner that it can be brought flush with the plane of the exposed ends of the through-via-hole.

It may be appreciated from the preceding description that the present invention eliminates the need of providing the wiring pattern specifically intended for the interconnection between the chip land and the corresponding through-via-hole. The closed through-via-hole that is obtained by filling the through-via-hole with the resin prevents any extra solder from overflowing when dipping the board in a solder bath.

BRIEF DESCRIPTION OF THE DRAWINGS

Those and other objects, advantages and features of the present invention will become more apparent from the detailed description of several preferred embodiments that will be described by referring to the accompanying drawings, in which.

DETAILED DESCRIPTION OF PREFERRED EMBODIMENTS

Figure 1A:
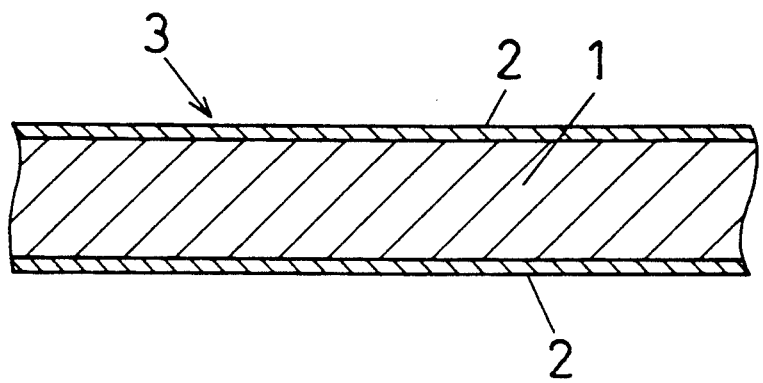
FIG. 1a through FIG. 1i represent the different stages of the manufacturing process according to the preferred embodiment of the present invention, depicting how a double-sided printed wiring board which is shown in an enlarged sectional view is being fabricated through each succeeding stage.

Referring to the drawings, several preferred embodiments of the present invention are described in further detail.

Referring first to FIG. 1a through FIG. 1i, the steps of completing a printed wiring board according to the present invention will be described.

Figure 1B:
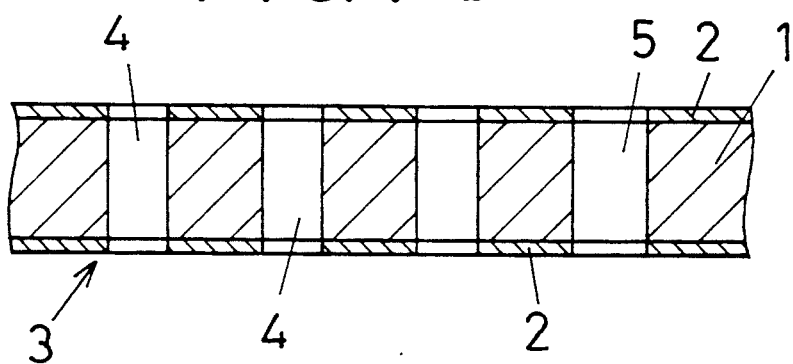

As shown in FIG. 1a, a base plate 1 which is 1 mm thick is formed to a square shape having the size of 340 mm × 340 mm. Then, a copper foil 2 which is 18 $\mu$m thick is laminated onto each of the opposite sides of the base plate 1. A copper foil laminated board 3 is thus obtained. Next, a plurality of through-holes 4, 4 each having a diameter of 0.3 mm are formed in the copper foil laminated board 3, and a plurality of holes 5, 5 each having a diameter of 0.8 mm are also formed (FIG. 1b). The holes 5, 5 are provided for accommodating a lead wire of electronic components therein.

Figure 1C:
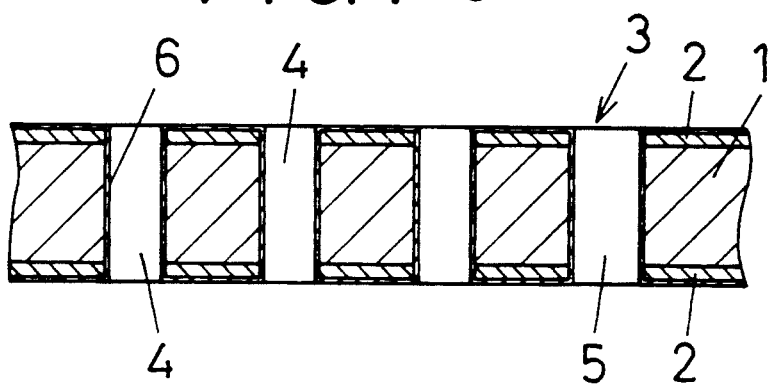
Figure 1D:
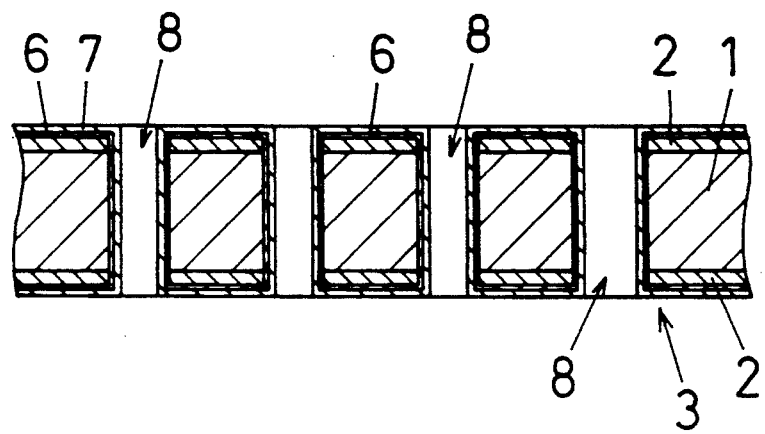

Then, the copper foil-laminated board 3 that has the through-holes 4, 4 and the component holes 5, 5 formed therein as described above goes through a non-electrolytic copper plating process during which a non-electrolytic copper layer 6 is plated on the opposite sides of the board 3, and on the internal walls of the board defining the through-holes 4, 4 and component holes 5, 5, respectively (FIG. 1c). The resulting layer 6 is 0.4 $\mu$m thick. Following the non-electrolytic copper plating process is an electrolytic copper plating process during which an electrolytic copper layer 7 is plated on the layer 6 at each part of the board 3 (FIG. 1d). The resulting layer 7 is 25 $\mu$m thick. Those two different copper layers 6 and 7 thus leave through-via-holes 8 within the original through-holes 4, 4 and component holes 5, 5, respectively.

Figure 1E:
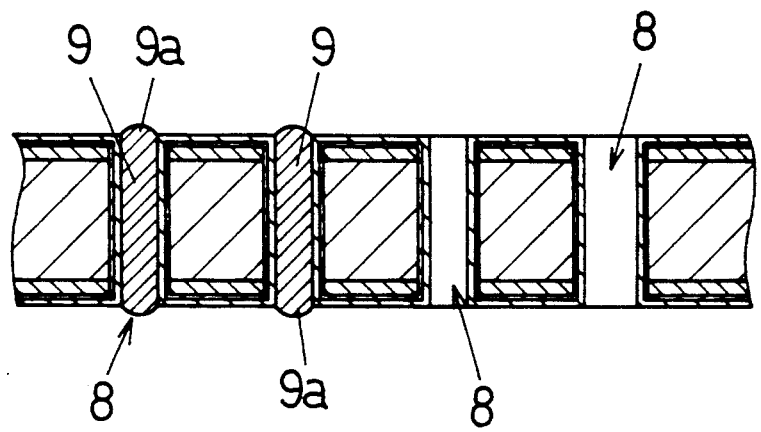

Next, a screen printing process is carried out in which an epoxy resin 9 fills some of the through-via-holes 8 and is allowed to solidify (FIG. 1e). The epoxy resin 9 that may be used in the screen printing may contain 2.3% of hydrocarbon selected from those elements in the aromatic group, and may be allowed to solidify under 130° C. heat applied for 30 minutes.

Figure 1F:
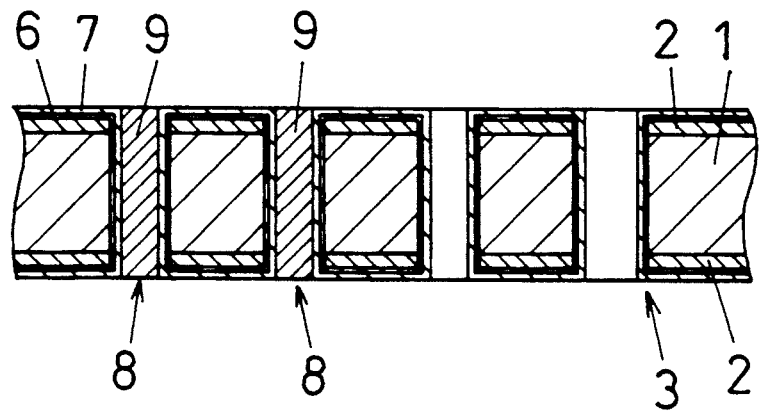
Figure 1G:
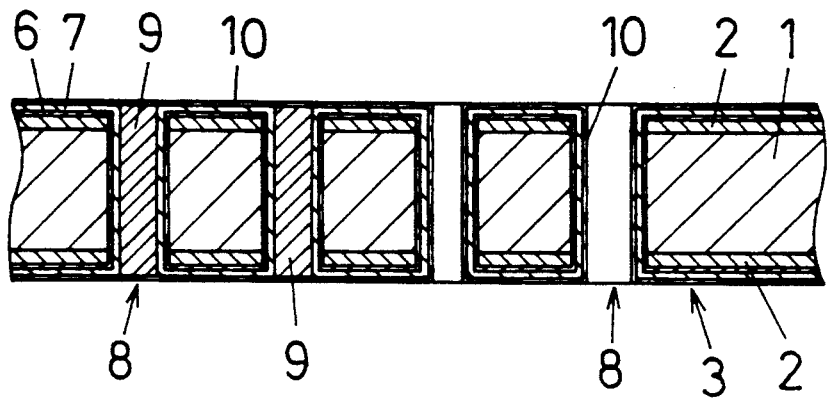

When the epoxy resin 9 is inserted in particular ones of the through-via-holes 8, some part of the epoxy resin 9 may overflow the then closed through-holes and solidify outside them. This overflow 9a may be removed and flattened by any suitable mechanical planing means until the solidified resin is flush with the plane extending through the open end (FIG. 1f).

Figure 1H:
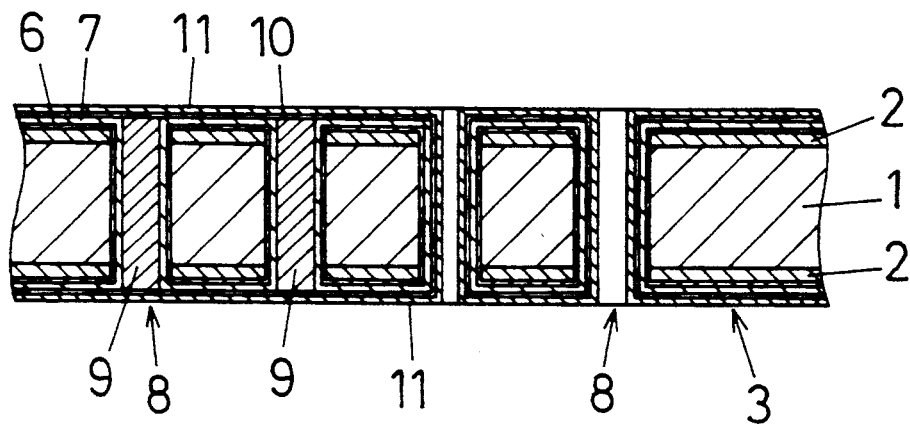
Figure 1I:
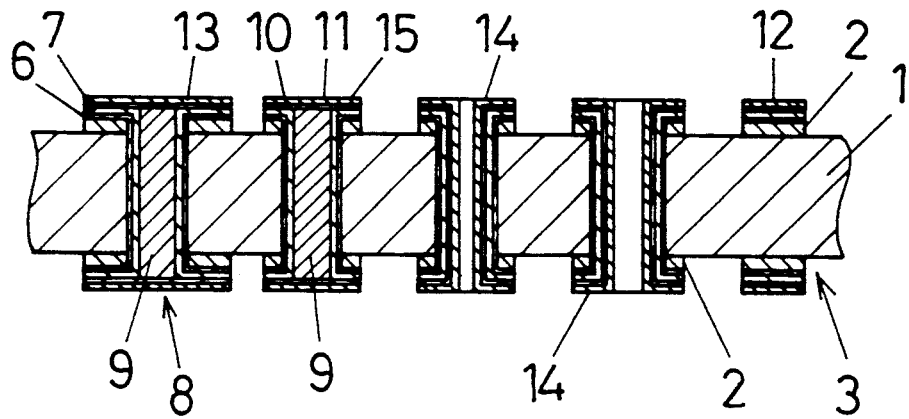

The copper foil laminated board 3 having the original (open) through-via-holes 8 and the filled (closed) through-holes formed during the preceding steps is again subjected to a non-electrolytic copper plating process, followed by another electrolytic copper plating process. Through those copper plating processes, a non-electrolytic copper layer 10 is first plated (FIG. 1g), and an electrolytic copper layer 11 is then plated on the layer 11 (FIG. 1h). In the final state, a light-sensitive drum film 13 is thermally laminated on the board 3, and only those portions of the board 3 which are required to be exposed are exposed to ultraviolet rays in a process such as a subtractive process. The remaining portions not exposed are removed during a development process. Then, the copper-plated portions are etched with a solution of ferric chloride. Thus, signal lines 12 are formed, and a chip land 13 is formed on the filled through-via-holes 8 (FIG. 1i).

Figure 2:
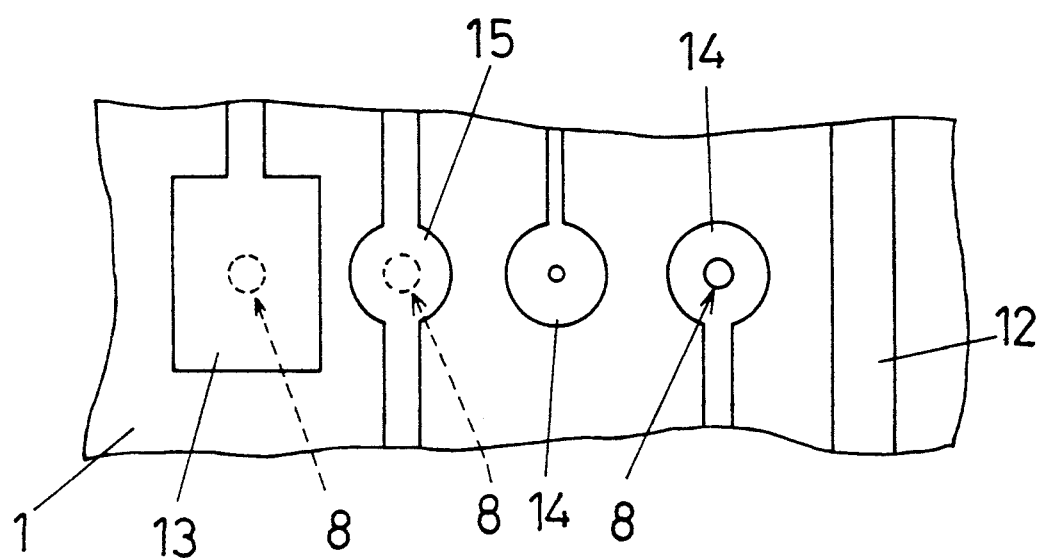
FIG. 2 is a schematic representation showing a chip land and other patterns in plan.

FIG. 2 depicts the chip land 13, signal line 12, and the pattern 14 aligned with an open through-via-hole 8 as well as a pattern 15 aligned with a closed through-via-hole 8.

The double-sided printed wiring board described above allows the chip land 13 and the pattern on the opposite side to be electrically conductively interconnected via the closed through-via-hole 8. This eliminates the need of providing a through-via-hole remotely from the chip land 13, and therefore it is not necessary to implement a wiring pattern to interconnect the chip land to a remote through-hole. Thus, a high-density packing can be realized.

When a lead wire such as resistor is inserted into a through-via-hole 8 formed from the component insertion hole 5, and is fixed thereto by dipping the board in solder, there is no risk that any surplus solder may overflow on the side of the printed wiring board where the chip land is located, because the chip land is located on the closed through-via-hole 8.

According to the present invention, the wiring pattern required to interconnect the chip land and the corresponding through-via-hole can be eliminated, and the space thus made available on the double-sided printed wiring board can be utilized for wiring the signal lines. Thus, the space can be better utilized so that high-density wiring can be achieved. Furthermore, the present invention allows for greater flexibility in designing the signal wiring pattern, which can easily be done on a CAD-implemented workstation or personal computer.

The present invention prevents any surplus solder from overflowing when an electronic component is soldered to the hole. Thus, ICs and other electronic or circuit components may be mounted on the printed wiring board without difficulty, and higher reliability can be achieved.

Although the present invention has been described with reference to the several preferred embodiments thereof, it should be understood that various changes and modifications may be made without departing from the scope and spirit of the invention as defined in the appended claims.

What is claimed is:

1. A double-sided printed wiring board comprising:
    a base plate having a through-hole extending therethrough;
    an electrically conductive layer disposed over a surface of the base plate defining said through-hole, said electrically conductive layer extending through said through-hole between the opposite sides of the base plate and over portions of said sides of the base plate, and said electrically conductive layer leaving a through-via-hole within said through-hole and which through-via-hole extends between the opposite sides of the base plate;
    a mass of solid resin filling said through-via-hole and having opposite ends located at each of the sides of the base plate, respectively; and
    a chip land of electrically conductive material covering one of the ends of said mass of solid resin at one side of said base plate, said chip land also covering a portion of the electrically conductive layer which extends over said one side of said base plate so as to be in an electrically conductive relation with said electrically conductive layer.

2. A double-sided printed wiring board as claimed in claim 1, wherein a second chip land of electrically conductive material covers the other end of said mass of resin filler at the other side of the base plate, said second chip land also covering a portion of the electrically conductive layer which extends over said other side of said base plate so as to be in an electrically conductive relation with said electrically conductive layer.

3. A double-sided printed wiring board as claimed in claim 1, wherein said base plate also has a component hole extending therethrough, and further comprising an electrically conductive layer disposed over a surface of the base plate defining said component hole and extending through said component hole between the opposite sides of the base plate and over portion of said sides of the base plate, said electrically conductive layer that extends through said component hole leaving a through-via-hole within said component hole and which through-via-hole is open at both sides of the base plate, whereby said through-via-hole left within said component hole can receive an electrical lead wire.

4. A double-sided printed wiring board as claimed in claim 3, wherein the composition of said electrically conductive layer extending through said through-hole and said chip land as viewed together is the same as the composition of said electrically conductive layer extending through said component hole.

5. A double-sided printed wiring board as claimed in claim 4, wherein said electrically conductive layer extending through said through-hole consists of platings of non-electrolytic and electrolytic copper, said chip land consists of platings of non-electrolytic and electrolytic copper, and said electrically conductive layer extending through said component hole consists of two each of platings of non-electrolytic and electrolytic copper alternately disposed.

* * * * *